US008648444B2

(12) United States Patent
Chen et al.

(10) Patent No.: US 8,648,444 B2
(45) Date of Patent: Feb. 11, 2014

(54) WAFER SCRIBE LINE STRUCTURE FOR IMPROVING IC RELIABILITY

(75) Inventors: Hsien-Wei Chen, Sinying (TW); Hao-Yi Tsai, Hsinchu (TW); Shin-Puu Jeng, Hsinchu (TW); Yu-Wen Liu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 918 days.

(21) Appl. No.: 12/054,082

(22) Filed: Mar. 24, 2008

(65) Prior Publication Data
US 2009/0140393 A1     Jun. 4, 2009

Related U.S. Application Data

(60) Provisional application No. 60/991,074, filed on Nov. 29, 2007.

(51) Int. Cl.
*H01L 21/78* (2006.01)

(52) U.S. Cl.
USPC ........... 257/620; 257/768; 257/797; 257/635; 257/E23.002; 257/E21.523; 438/761; 438/622; 438/460; 438/113; 438/110

(58) Field of Classification Search
USPC ............. 438/460, 462, 33, 68, 110, 113, 114, 438/401, 465, 758, 761; 257/758, E23.179, 257/409, 797, 508, E21.599, E21.523, 257/E21.524, 211, 618–620, 626, 635, 734, 257/750, E23.001, E23.002, E21.522
See application file for complete search history.

(56) References Cited

U.S. PATENT DOCUMENTS

| | | | | |
|---|---|---|---|---|
| 5,777,392 A * | 7/1998 | Fujii | ............................. | 257/797 |
| 6,081,040 A * | 6/2000 | Okuda et al. | .................. | 257/797 |
| 6,171,976 B1 * | 1/2001 | Cheng | ........................... | 438/760 |
| 6,521,975 B1 * | 2/2003 | West et al. | .................... | 257/620 |
| 6,548,901 B1 * | 4/2003 | Cote et al. | .................... | 257/758 |
| 6,890,846 B2 * | 5/2005 | Noguchi | ....................... | 438/622 |
| 6,893,943 B2 * | 5/2005 | Ohsumi et al. | ............... | 438/462 |
| 7,126,225 B2 | 10/2006 | Su et al. | | |
| 7,141,882 B2 * | 11/2006 | Watanabe | ..................... | 257/758 |
| 7,183,137 B2 * | 2/2007 | Lee et al. | ..................... | 438/114 |
| 7,265,038 B2 * | 9/2007 | Wu et al. | ...................... | 438/513 |
| 7,387,950 B1 * | 6/2008 | Kuo et al. | ..................... | 438/462 |
| 7,453,128 B2 * | 11/2008 | Tsutsue et al. | ............... | 257/409 |
| 7,498,660 B2 * | 3/2009 | Kumagai | ..................... | 257/620 |

(Continued)

FOREIGN PATENT DOCUMENTS

JP        2005-228892 A        8/2005

OTHER PUBLICATIONS

Corresponding Chinese official action 200810181940X.

*Primary Examiner* — Cuong Q Nguyen
*Assistant Examiner* — Galina Yushina
(74) *Attorney, Agent, or Firm* — Slater & Matsil, L.L.P.

(57) ABSTRACT

A semiconductor wafer having a multi-layer wiring structure is disclosed. The wafer comprises a plurality of chip die areas arranged on the wafer in an array and scribe line areas between the chip die areas. The scribe lines of a semiconductor wafer having USG top-level wiring layers above ELK wiring layers have at least one metal film structures substantially covering corner regions where two scribe lines intersect to inhibit delamination at the USG/ELK interface during wafer dicing operation.

12 Claims, 10 Drawing Sheets

(56) References Cited

U.S. PATENT DOCUMENTS

| | | |
|---|---|---|
| 7,586,176 B2 * | 9/2009 | Wang et al. .................. 257/620 |
| 7,799,688 B2 * | 9/2010 | Kurata et al. ................. 438/692 |
| 2003/0163794 A1 * | 8/2003 | Horie et al. ........................ 716/8 |
| 2004/0145028 A1 | 7/2004 | Matsumoto et al. |
| 2004/0207078 A1 | 10/2004 | Su et al. |
| 2005/0110120 A1 | 5/2005 | Wang et al. |
| 2005/0136622 A1 * | 6/2005 | Mulligan et al. ............. 438/460 |
| 2005/0139964 A1 | 6/2005 | Ando |
| 2005/0224920 A1 | 10/2005 | Onuma |
| 2005/0282360 A1 * | 12/2005 | Kida et al. .................... 438/462 |
| 2006/0001144 A1 | 1/2006 | Uehling et al. |
| 2006/0109014 A1 * | 5/2006 | Chao et al. .................... 324/754 |
| 2006/0125059 A1 | 6/2006 | Chen et al. |
| 2006/0189099 A1 * | 8/2006 | Lu et al. ....................... 438/460 |
| 2006/0261490 A1 | 11/2006 | Su et al. |
| 2007/0082298 A1 | 4/2007 | Sakamoto |
| 2007/0102792 A1 * | 5/2007 | Wu ................................ 257/620 |
| 2007/0184635 A1 | 8/2007 | McCollum |
| 2008/0265378 A1 * | 10/2008 | Lee et al. ...................... 257/620 |

\* cited by examiner

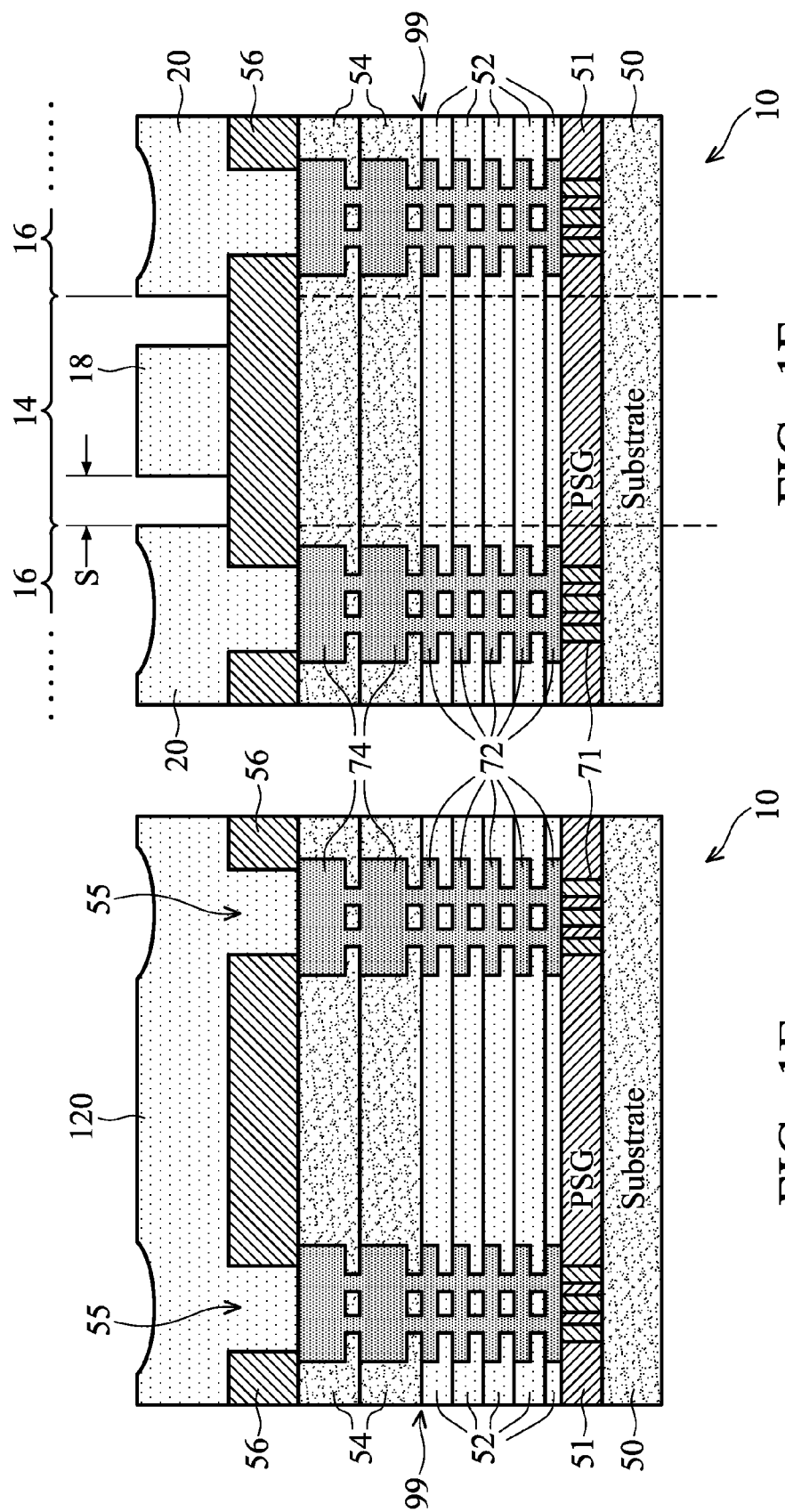

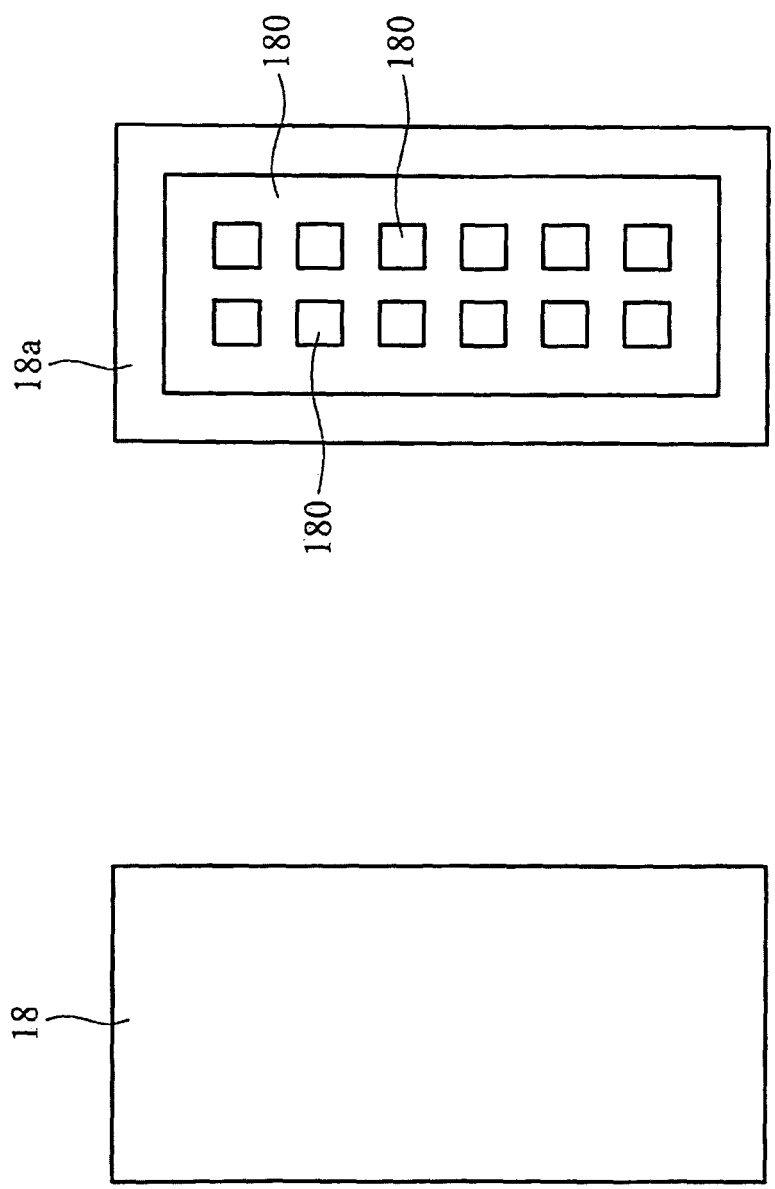

WAFER SCRIBE LINE STRUCTURE FOR IMPROVING IC RELIABILITY

CROSS-REFERENCE TO RELATED APPLICATIONS

This is a U.S. non-provisional application claiming the benefit of U.S. provisional patent application Ser. No. 60/991,074 filed on Nov. 29, 2007, the entire disclosure of which is incorporated herein by reference.

FIELD OF THE INVENTION

This disclosure is generally related to a semiconductor wafer including one or more inter-metal-dielectric (IMD) layers of extremely-low dielectric constant (ELK) dielectric and one or more IMD layers of undoped silica glass (USG) layers for the top layer wiring layers and the wafer's scribe structure.

BACKGROUND

Integrated circuit (IC) devices are formed in multiples on semiconductor wafers and then diced into individual IC devices. The IC devices generally have rectilinear shapes and are formed in a matrix array on semiconductor wafers. Once the formation of IC devices are completed, the semiconductor wafers are diced into individual IC devices. The dicing operation involves scribing between the rows and columns of the IC devices on the semiconductor wafers using a dicing saw. The area between the IC devices that get scribed are called scribe lines.

The scribing is carried out on the active side of the semiconductor wafers where the integrated circuits and the multi-layer wiring layers of the IC devices are formed and the scribe lines are defined in the areas of the wafer between each individual IC devices (die patterns). The scribe line areas do not have circuit elements of the die areas and because each die is an independent device, the metal features for interconnect wiring conductors are also confined to the die areas and do not extend into or across the scribe lines where the die saw will cut through the wiring layers. However, some wafer-level reliability and functionality test pads are located in the scribe line areas to facilitate wafer-level testing. In such wafers, the die sawing across the test pads generally results in severe dielectric peeling and cracking. These delaminations easily become sources of defects that detrimentally affect reliability of the diced chips.

In semiconductor wafers for advanced 45 nm dimension IC devices, the lower level wiring layers, also known as IMD layers, use ELK dielectric materials as the insulator material between the wiring conductor features. An example of an ELK dielectric material is a trimethylsilane-based organosilicate glass with a dielectric constant as low as about 2.1. In these wafers, one or more top-level wiring layers above the ELK layers are formed of undoped silicate glass (USG) as the insulator material between the wiring conductor features. In these wafers, the interface between the ELK layers and the USG layers suffer high level of delamination at the corner areas during scribing of the scribe lines by the dicing saw, regardless of whether there are metal features in the corner areas. The delamination is believed to be caused by high level of residual stress at the ELK/USG interface attributed to the substantial difference in the coefficient of thermal expansion (CTE) and Young's modulus between the ELK and the USG insulators. The CTE and Young's modulus of the ELK material is substantially different from those of the USG. The typical CTE and Young's modulus of ELK dielectric is about 0.7 ppm/° C. and 10 GPa, respectively. The typical CTE and Young's modulus of USG material is about 0.5 ppm/° C. and 70 GPa.

The peeling defects cause reliability problems with the IC devices and are not desired. Thus, there is a need for improved scribe line structures especially for IC devices utilizing ELK dielectric for IMD layers and USG dielectric for top-level wiring layers.

SUMMARY

According to an embodiment of the present disclosure, a semiconductor wafer having a multi-layer wiring structure is disclosed. The wafer comprises a plurality of chip die areas arranged on the wafer in an array and scribe line areas between the chip die areas. The chip die areas have a structure comprising a first set of one or more wiring layers comprising conductor metal features and a first dielectric material providing insulation between the first set of conductor metal features. A second set of one or more wiring layers overly the first set of wiring layers and comprise a second set of conductor metal features and a second dielectric material providing insulation between the second set of conductor metal features, wherein the first dielectric material has lower dielectric constant than the second dielectric material. The first and second set of conductor metal features do not extend into the scribe line areas. A top-level passivation layer overlies the second set of one or more wiring layers.

The scribe line areas comprise a plurality of metal film structures are provided on top of the top-level passivation layer, wherein each of the metal film structures substantially occupy a corner region in the scribe line areas, whereby the presence of the metal film structures in the corner regions inhibit the occurrence of delamination between the first dielectric material and the second dielectric material in the corner region during wafer dicing operation. The corner region is defined by the intersection of two scribe lines.

According to another embodiment, the plurality of metal film structures in the scribe line areas are provided within the top-level passivation layer, wherein each of the metal film structures substantially occupy a corner region in the scribe line areas.

BRIEF DESCRIPTION OF THE DRAWINGS

FIGS. 1C-1F are cross-sectional views taken along the line B-B shown in FIG. 1B showing the interim stages in forming the structure of the scribe line area according to an embodiment of the present disclosure.

FIGS. 4A-4D are illustrations of variations of metal film structures that can be provided in the scribe lines of a wafer according to the present disclosure.

The features shown in the above referenced drawings are illustrated schematically and are not intended to be drawn to scale nor are they intended to be shown in precise positional relationship. Like reference numbers indicate like elements.

DETAILED DESCRIPTION

Figure 1A:
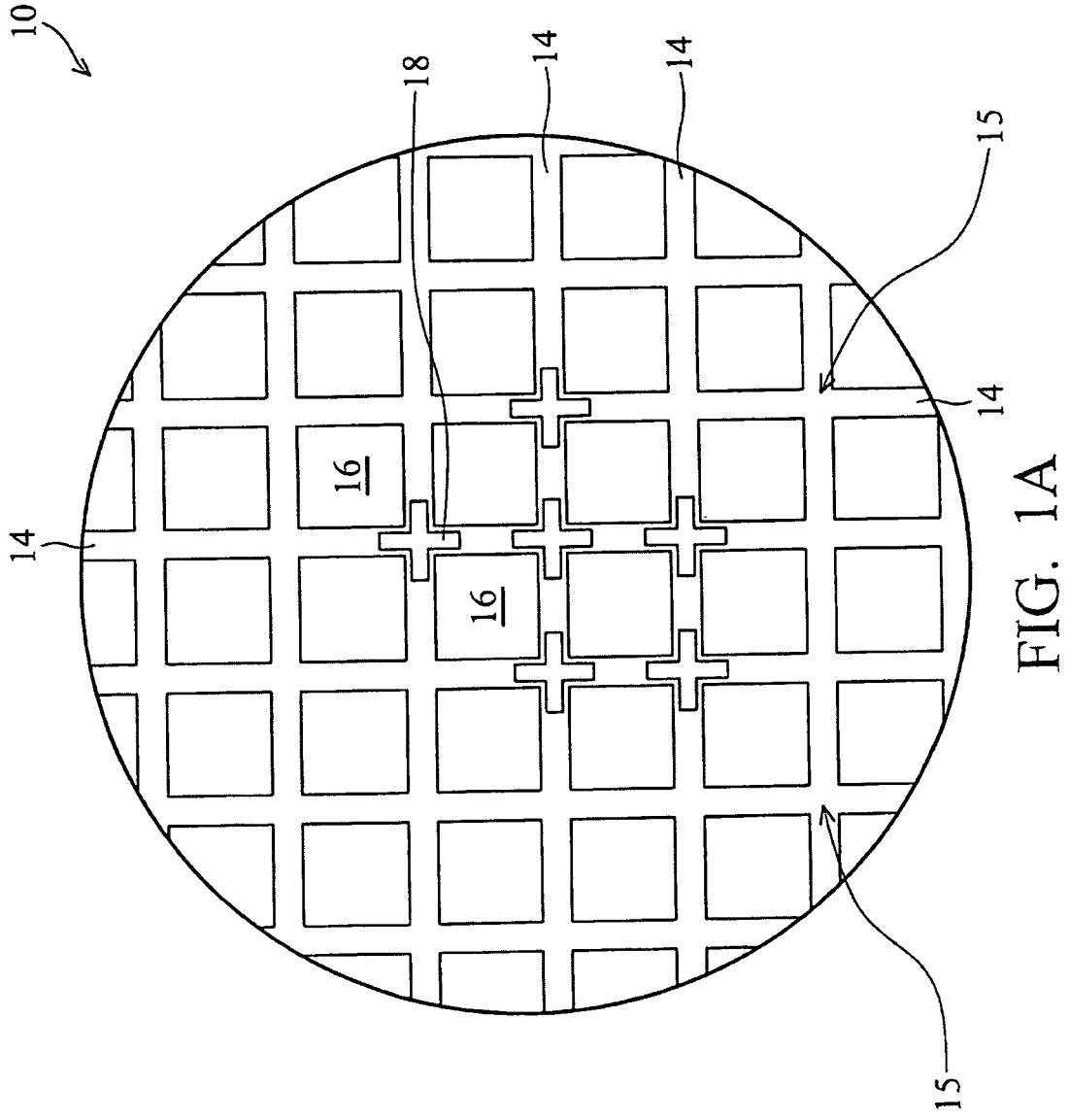
FIG. 1A is a plan view of a wafer whose scribe lines have structures according to an embodiment of the present disclosure.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

FIG. 1A is a plan view of a semiconductor wafer 10 with dies separated by scribe lines according to one embodiment is illustrated. The semiconductor wafer 10 comprises an array of dies (or chips) 16 separated from each other by two sets of intersecting scribe lines 14. One set of scribe lines 14 extend along a first direction and a second set of scribe lines 14 extend along a second direction. The intersections of the two sets of scribe lines define corner regions 15 that are substantially covered with metal film structures 18. For illustrative purposes only some of the metal film structures 18 are shown in FIG. 1A but according to the present disclosure, the metal film structures 18 are provided in every corner region 15 on the wafer 10.

Figure 1B:
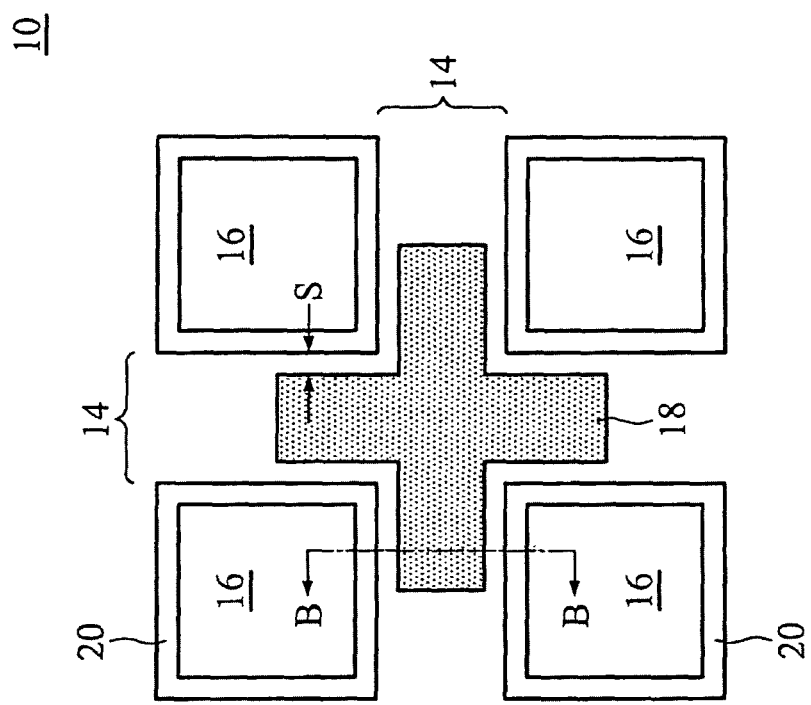
FIG. 1B is a plan view illustration of a detailed view of a corner region of the scribe lines on the wafer of FIG. 1A according to one embodiment.

FIG. 1B is a detailed view of a corner region of the wafer 10 shown in FIG. 1A. A metal film structure 18 substantially occupies the corner region defined by the two intersecting scribe lines 14. Each of the dies 16 is surrounded by a sealing ring structure, the top of which is represented by 20, that protect the circuitry area of the dies 16 from an damage such as dicing saw induced cracks and moisture. According to an aspect of the present disclosure, the spacing S between the metal film structure 18 and the neighboring sealing rings 20 is no more than 6 μm to insure that substantial portion of the corner region is covered by the metal film structure 18. The width of the scribe lines 14 is 30-100 μm.

Figures 1C, 1D:
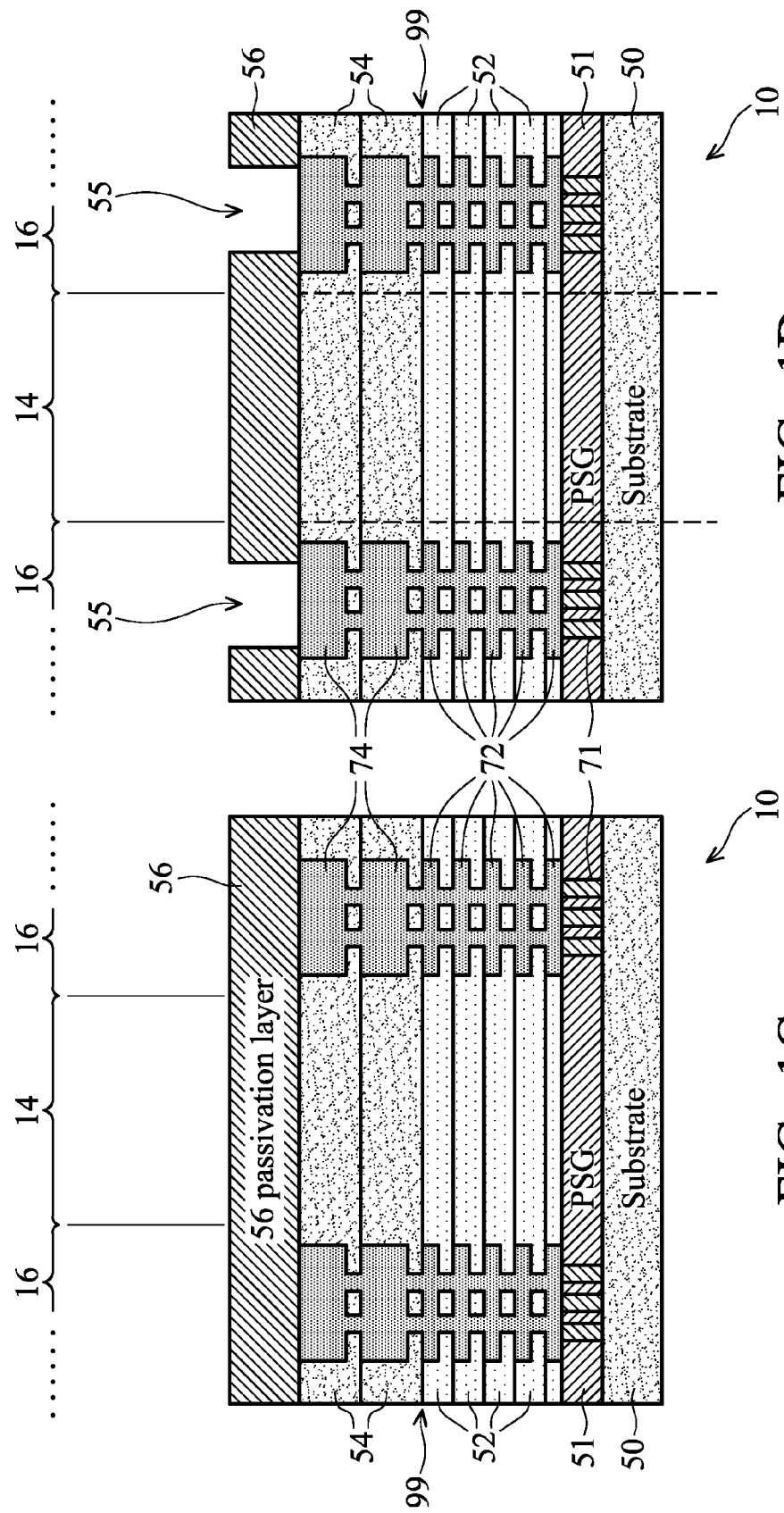

FIGS. 1C-1F are cross-sectional views of the semiconductor wafer 10 taken along the line B-B shown in FIG. 1B showing the interim structures as the metal film structures are formed in the scribe line areas according to an embodiment of the present disclosure. FIG. 1C shows plurality of wiring layers 52 and 54 formed on top of a silicon substrate 50 in the die areas 16. The scribe line 14 is between the two die areas 16. On top of the active devices (not shown) of the silicon substrate 50 is generally formed an insulation layer 51 formed of phosphorous silicate glass (PSG). The PSG layer 51 is provided with through via conductors 71 connecting the active devices on the silicon substrate 50 to the interconnecting wiring layers above.

The plurality of wiring layers comprise a first set of one or more wiring layers 52. Each of the first set of one or more wiring layers 52 also includes a plurality of first set of conductor metal features 72 and first dielectric material providing insulation between the first set of conductor metal features 72. As shown, the scribe line area 14 in these wiring layers 52 is free of the first set of interconnecting conductor metal features 72.

A second set of one or more wiring layers 54, also called the top-level wiring layers, are provided above the first set of wiring layers 52. Each of the second set of one or more wiring layers 54 also includes a plurality of second set of conductor metal features 74 and second dielectric material providing insulation between the second set of conductor metal features 74. The scribe line area 14 in the second set of wiring layers 54 is also free of the second set of interconnecting conductor metal features 74. The first and second set of conductor metal features 72, 74 are usually formed of copper metal. The multiple conductor metal features 72 and 74 along with the top sealing ring layer 20 form the sealing ring structures well known in the art.

The first dielectric material forming the insulation layers in the first set of wiring layers 52 has lower dielectric constant than the second dielectric material and can be a low-k (LK) dielectric material or an extremely-low-k (ELK) dielectric material. LK dielectric materials are those having dielectric constant between about 3.0 to 2.6. ELK dielectric material are those having dielectric constant of about 2.6 or lower. The second dielectric material forming the insulation layers in the second set of one or more wiring layers 54 are usually formed with dielectric material having higher Young's modulus (i.e. higher mechanical strength) than the first dielectric material and can be undoped silicate glass (USG), fluorine-doped silica glass (FSG) or silicon nitride (NIT). The second dielectric material has a dielectric constant greater than about 3.4.

Referring to FIG. 1C, a top-level passivation layer 56 is deposited over the second set of wiring layers 54. The top-level passivation layer 56 can be formed of USG, FSG or NIT and can be deposited by a chemical vapor deposition (CVD) process. Referring to FIG. 1D, the top-level passivation layer 56 is patterned by photolithography to form openings 55 over the conductor metal features 74 of the wiring layers 54. Referring to FIG. 1E, a blanket layer of aluminum metal 120 is deposited over the patterned top-level passivation layer 56. The blanket aluminum metal 120 fills the openings 55 and contacts the second set of conductor metal features 74. Referring to FIG. 1F, the aluminum metal layer 120 is then patterned by photolithography forming the top sealing ring layers 20 in the die areas 16 and the metal film structures 18 in the scribe lines 14. A spacing S is maintained between the metal film structure 18 and the neighboring seal ring structures so that the metal film structure 18 does not contact the seal ring structures 20, 72, 74.

The provision of the metal film structures 18 in the corner regions of the scribe lines 14 on top of the top-level passivation layer 56 minimizes or eliminates delamination at the interface 99 between the first dielectric material and the second dielectric material. The provision of the metal film structures 18 reduces the residual stress at the interface 99 caused by the CTE and Young's modulus mismatch between the lower dielectric constant first dielectric material layers and the higher dielectric constant second dielectric material layers.

Figure 2A:
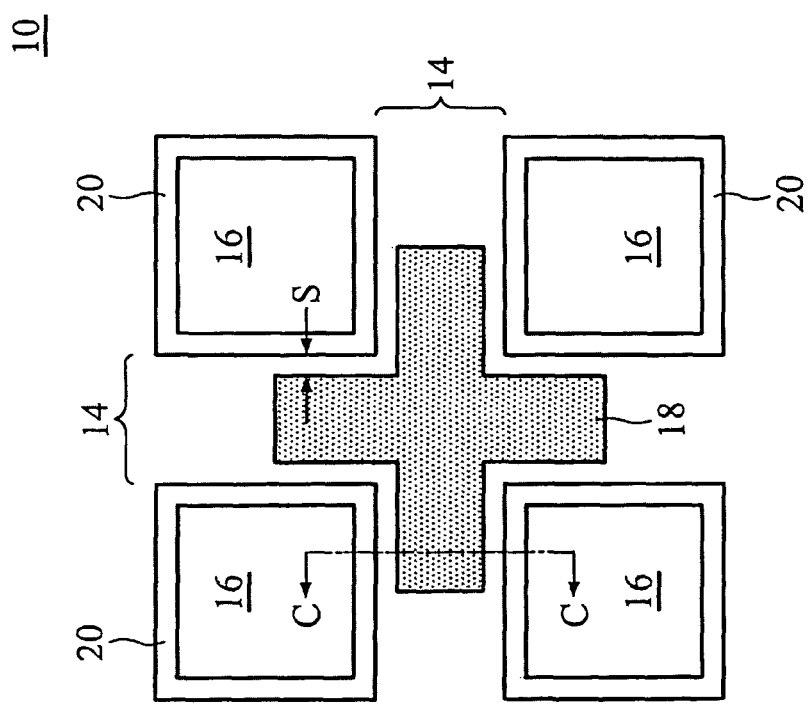
FIG. 2A is a plan view illustration of a detailed view of a corner region of the scribe lines on the wafer of FIG. 1A according to another embodiment.

FIGS. 2A-2E show the structure of the scribe line 14 for the wafer 10 according to another embodiment. FIG. 2A is a detailed view of a corner region of the wafer 10. As in the embodiment of FIGS. 1B-1F, the metal film structure 18 substantially occupies the corner region defined by the two intersecting scribe lines 14 as seen in this plan view. Each of the dies 16 is surrounded by a sealing ring structure 20 that protect the circuitry area of the dies 16 from an damage such as dicing saw induced cracks and moisture. The spacing S between the metal film structure 18 and the neighboring sealing rings 20 is no more than 6 μm to insure that substantial portion of the corner region is covered by the metal film structure 18. The width of the scribe lines 14 is 30-80 μm. Thus, each of the metal film structure 18 substantially occupies the scribe line area in the corner region. Given the spacing S and the width of the scribe lines 14, each of the metal film structures 18 cover 60% to 85% of the width of the scribe line areas in a corner region.

Figures 2B, 2C:
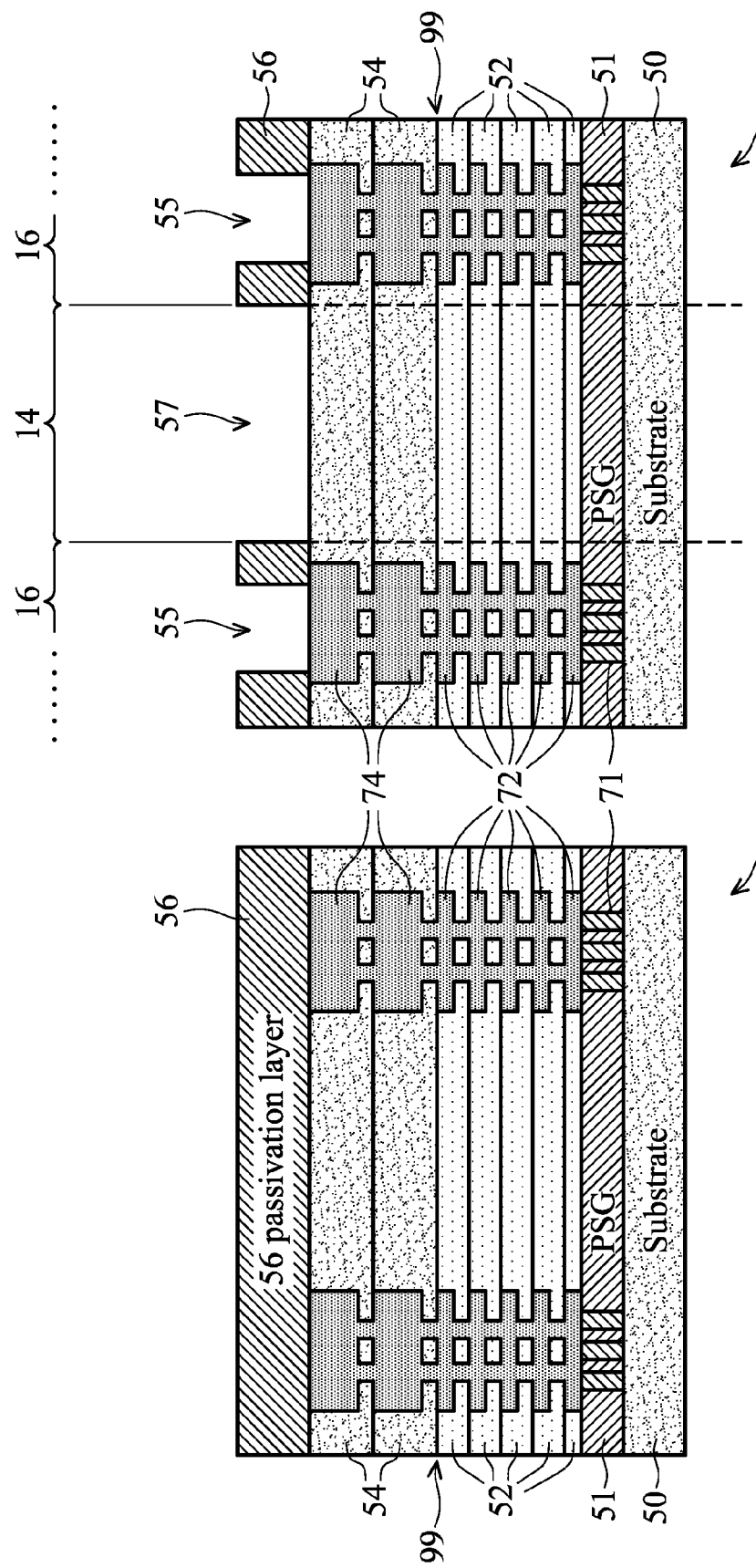
FIGS. 2B-2E are cross-sectional views taken along the line C-C shown in FIG. 2A showing the interim stages in forming the structure of the scribe line area according to an embodiment of the present disclosure.
Figure 2E:
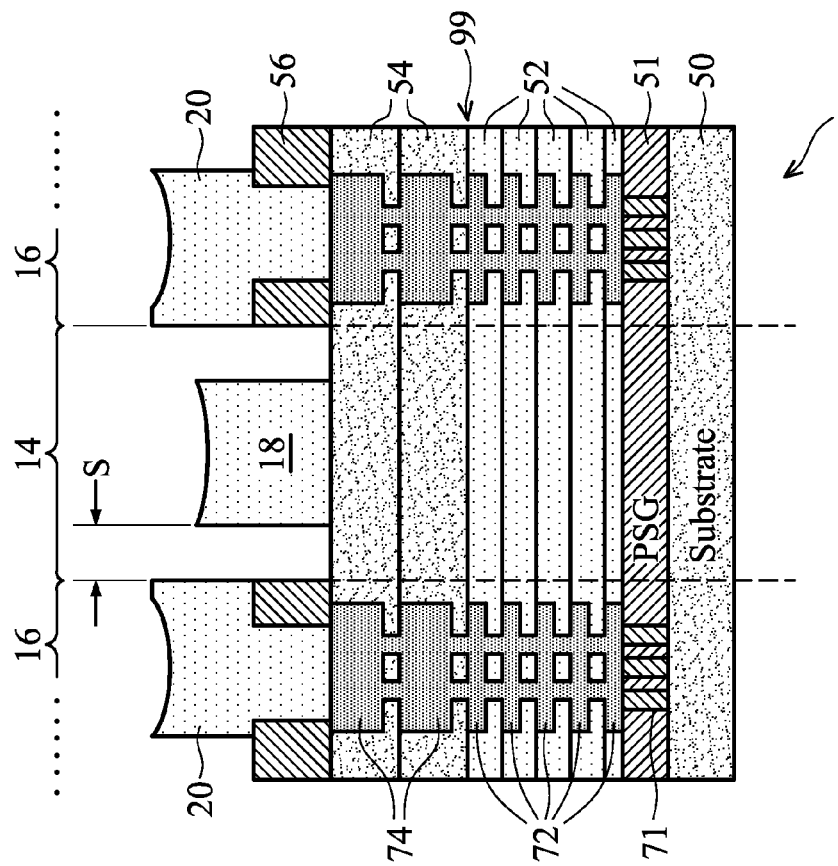
Figure 2D:
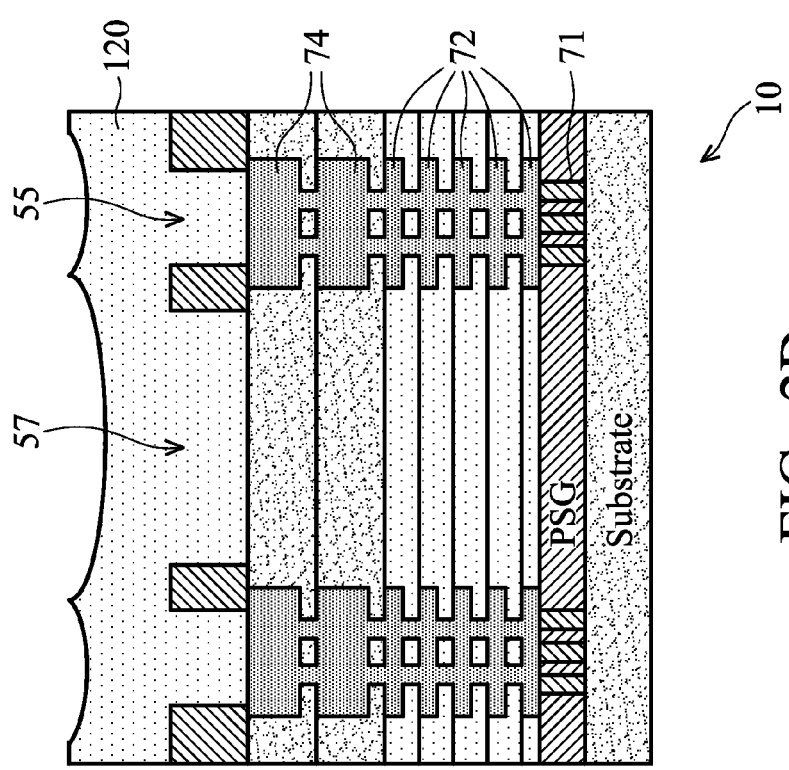

FIGS. 2B-2E are cross-sectional views of the semiconductor wafer 10 taken along the line C-C shown in FIG. 2A showing the interim structures as the metal film structures are formed in the scribe line areas according to another embodiment of the present disclosure. Referring to FIG. 2B, a top-level passivation layer 56 is deposited over the second set of wiring layers 54 of the wafer 10. The top-level passivation layer 56 can be formed of USG, FSG or NIT and can be deposited by a chemical vapor deposition (CVD) process. Referring to FIG. 2C, the top-level passivation layer 56 is patterned by photolithography to form openings 55 over the conductor metal features 74 of the wiring layers 54 and openings 57 in the scribe line areas 14. Referring to FIG. 2D, a blanket layer of aluminum metal 120 is deposited over the patterned top-level passivation layer 56. The blanket aluminum metal 120 fills the openings 55 and 57. Referring to FIG. 2E, the aluminum metal layer 120 is then patterned by photolithography forming the sealing rings 20 in the die areas 16 and the metal film structures 18 in the scribe lines 14. In this embodiment, because the metal film structure 18 is formed within the opening 57 in the top-level passivation layer 56, the metal film structure 18 sits directly on the wiring layer structure rather than on the top-level passivation layer 56.

As in the previous embodiment, a spacing S is maintained between the metal film structure 18 and the neighboring seal ring structures 20 so that the metal film structure 18 does not contact the seal ring structures 20. The provision of the metal film structures 18 in the scribe lines' corner regions minimizes or eliminates delamination at the interface 99 between the first dielectric material and the second dielectric material. The provision of the metal film structures 18 reduces the residual stress at the interface 99 caused by the CTE and Young's modulus mismatch between the lower dielectric constant first dielectric material layers and the higher dielectric constant second dielectric material layers.

The inventors have discovered that the provision of the metal film structures 18 reduces or eliminates delamination at the ELK/USG interface 99 is caused by the substantially different CTE and Young's modulus between ELK and USG material. From the simulation results, the residual stress between ELK/USG interfaces can be lowered as much as 30% after placing the dummy metal film structures 18 in the corner regions of the scribe line areas 14. The average latent energy of the USG/metal composite structure is brought closer to the latent energy of the ELK layers. This reduces the residual stress at the ELK/USG interface and inhibits delamination of the ELK/USG interface during the wafer dicing process.

Figure 3:
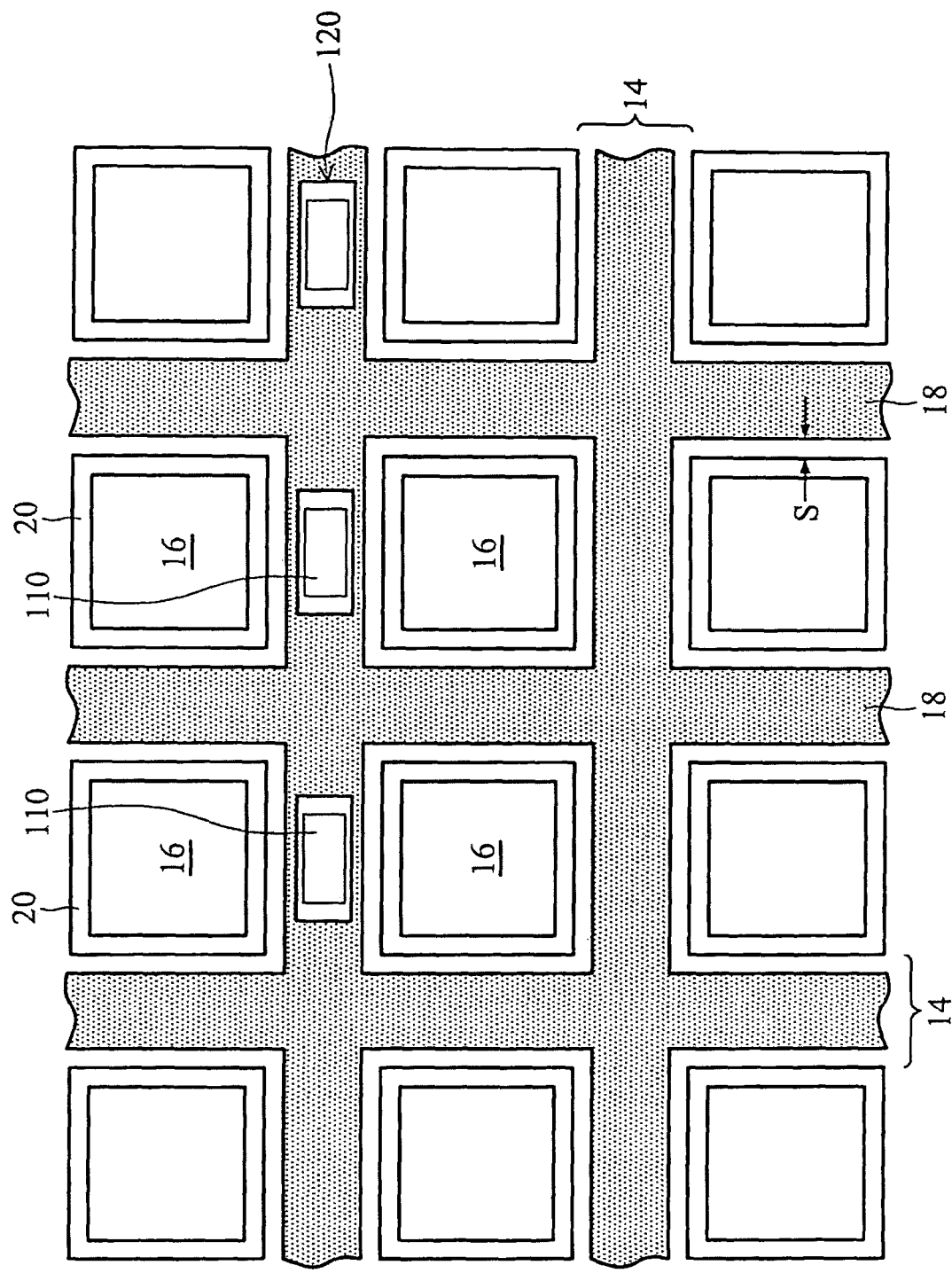
FIG. 3 is a plan view illustration of a portion of a wafer whose scribe lines have structures according to another embodiment of the present disclosure.

Referring to FIG. 3, according to another embodiment, the metal film structures 18 need not be limited to the corner regions of the scribe line areas 14. As shown, the metal film structure 18 can extend the full length of the scribe lines 14 on the wafer out to the wafer edges so that the metal film structure 18 occupies substantially all scribe lines in one continuous film. The spacing S between the metal film structure 18 and the seal rings 20 is maintained as in the previous embodiments. If there are other metal features 110, such as test pads, etc. in the scribe lines 14, the metal film structure 18 can be configured to have windows or holes 120 to accommodate such other metal features.

Figure 4C:
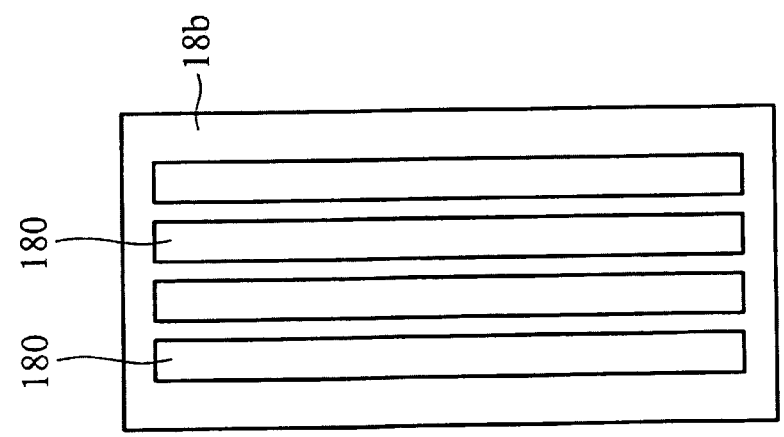
Figure 4D:
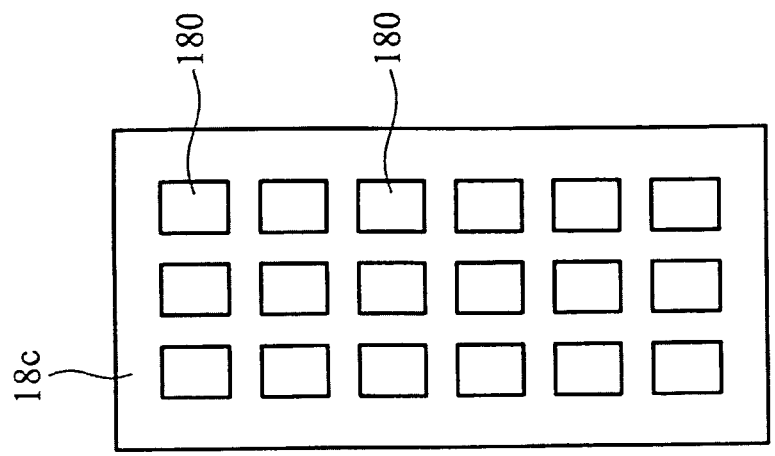

Referring to FIGS. 4A-4D, the metal film structures 18 need not be limited to the substantially solid film configuration as shown in the previous embodiment and shown again in FIG. 4A. The metal film structure can have a variety of patterns as shown in the films 18a, 18b and 18c of FIGS. 4B-4D as long as the resulting metal film structure has somewhat uniform and symmetric surface coverage in the X-Y plane. In FIG. 4B, the areas marked as 18a are solid metal film and the areas marked as 180 are holes. In FIG. 4C, the area marked as 18b is a solid metal film and the areas marked as 180 are holes. In FIG. 4D, the area marked as 18c is a solid metal film and the areas marked as 180 are holes.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A semiconductor wafer having a multi-layer wiring structure, said wafer comprising:
 a plurality of chip die areas arranged on the wafer in an array, wherein each of said plurality of chip die areas having a structure comprising:
  a first set of one or more wiring layers comprising a first set of conductor metal features and a first dielectric material providing insulation between the first set of conductor metal features;
  a second set of one or more wiring layers overlying the first set of wiring layers and comprising a second set of conductor metal features and a second dielectric material providing insulation between the second set of conductor metal features, wherein the first dielectric material has lower dielectric constant than the second dielectric material; and
  a top-level passivation layer overlying the second set of one or more wiring layers;
 scribe line areas between the chip die areas, wherein the first and second set of wiring conductor metal features do not extend into the scribe line areas and the scribe line areas comprise:
  a plurality of metal film structures provided on the top-level passivation layer, each of the metal film structures substantially occupying a corner region in the scribe line areas, said corner region being defined by an intersection of two scribe lines, wherein the metal film structures extend continuously from the corner region into a region between two adjacent chip die areas, wherein the corner region is defined by the intersection of two scribe lines, whereby the presence of the metal film structures in the corner regions inhibit the occurrence of delamination between
 the first dielectric material and the second dielectric material in the corner region during wafer dicing operation; and
  a conductive structure of a seal ring located in a perimeter of the chip die area, the conductive structure of the seal ring extending through the top-level passivation layer to connect to the second set of one or more wiring layers, the conductive structure of the seal ring having a tops surface that is at least partially planar with a top surface of at least one of the plurality of metal film structures.

2. The semiconductor wafer of claim 1, wherein said extending portions of the metal film structures maintain a spacing of less than or equal to 6 μm from the conductive structure of the seal ring along said length that extends in between the two adjacent chip die areas.

3. The semiconductor wafer of claim 1, wherein the plurality of metal film structures are formed of aluminum.

4. The semiconductor wafer of claim 1, wherein the first dielectric constant material is a low-k dielectric material such as a trimethylsilane-based organosilicate glass.

5. The semiconductor wafer of claim 1, wherein the second dielectric constant material is one of undoped silicate glass, fluorine-doped silica glass or NIT.

6. The semiconductor wafer of claim 1, wherein the top-level passivation layer is one of undoped silicate glass, fluorine-doped silica glass or NIT.

7. A semiconductor wafer having a multi-layer wiring structure, said wafer comprising:
a plurality of chip die areas arranged on the wafer in an array, wherein each of said plurality of chip die areas having a structure comprising:
a first set of one or more wiring layers comprising a first set of conductor metal features and a first dielectric material providing insulation between the first set of conductor metal features;
a second set of one or more wiring layers overlying the first set of wiring layers and comprising a second set of conductor metal features and a second dielectric material providing insulation between the second set of conductor metal features, wherein the first dielectric material has lower dielectric constant than the second dielectric material; and
a top-level passivation layer overlying the second set of one or more wiring layers;
scribe line areas between the chip die areas, wherein the first and second set of wiring conductor metal features do not extend into the scribe line areas and the scribe line areas comprise:
a plurality of metal film structures provided on the top-level passivation layer, each of the plurality of metal film structures substantially occupying and covering 60% to 85% of the width of the scribe line areas at a corner region and, wherein the corner region is defined by an intersection of two scribe lines, wherein the metal film structures extend continuously from the corner region into a region between two adjacent chip die areas, whereby the presence of the metal film structures in the corner regions inhibit the occurrence of delamination between the first dielectric material and the second dielectric material in the corner region during wafer dicing operation; and
a conductive structure of a seal ring within the chip die area and in physical contact with the second set of one or more wiring layers, the conductive structure of the seal ring having at least a portion over the top-level passivation layer, the at least a portion having a height over the top-level passivation layer that is the same as at least one of the plurality of metal film structures.

8. The semiconductor wafer of claim 7, wherein said extending portions of the metal film structures maintain a spacing of less than or equal to 6 μm from the conductive structure of the seal ring along said length that extends in between the two adjacent chip die areas.

9. The semiconductor wafer of claim 7, wherein the plurality of metal film structures are formed of aluminum.

10. The semiconductor wafer of claim 7, wherein the first dielectric constant material is a low-k dielectric material such as a trimethylsilane-based organosilicate glass.

11. The semiconductor wafer of claim 7, wherein the second dielectric constant material is one of undoped silicate glass, fluorine-doped silica glass or NIT.

12. The semiconductor wafer of claim 7, wherein the top-level passivation layer is one of undoped silicate glass, fluorine-doped silica glass or NIT.

\* \* \* \* \*

UNITED STATES PATENT AND TRADEMARK OFFICE
CERTIFICATE OF CORRECTION

PATENT NO.         : 8,648,444 B2                                Page 1 of 1
APPLICATION NO.    : 12/054082
DATED              : February 11, 2014
INVENTOR(S)        : Hsien-Wei Chen It is certified that error appears in the above-identified patent and that said Letters Patent is hereby corrected as shown below:

In the Claims

In Col. 6, line 65, claim 1, delete "tops" and insert --top--.

Signed and Sealed this
Twenty-ninth Day of April, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,648,444 B2
APPLICATION NO. : 12/054082
DATED : February 11, 2014
INVENTOR(S) : Chen et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1045 days.

Signed and Sealed this
Seventeenth Day of June, 2014

Michelle K. Lee
*Deputy Director of the United States Patent and Trademark Office*